(12) United States Patent
Kim et al.

(10) Patent No.: US 7,557,033 B2
(45) Date of Patent: Jul. 7, 2009

(54) METHOD OF FORMING METAL LINE OF SEMICONDUCTOR MEMORY DEVICE

(75) Inventors: Eun Soo Kim, Incheon (KR); Seung Hee Hong, Seoul (KR); Cheol Mo Jeong, Kyeongki-do (KR); Jung Geun Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 223 days.

(21) Appl. No.: 11/647,087

(22) Filed: Dec. 27, 2006

(65) Prior Publication Data

US 2008/0003814 A1    Jan. 3, 2008

(30) Foreign Application Priority Data

Jun. 30, 2006   (KR)   ............ 10-2006-0060600

(51) Int. Cl.
*H01L 21/4763* (2006.01)
(52) U.S. Cl. ............ 438/636; 438/643; 438/653
(58) Field of Classification Search ......... 438/622, 438/625, 627, 636, 642, 643, 653, 669, 687, 438/688
See application file for complete search history.

(56) References Cited

U.S. PATENT DOCUMENTS

| 6,433,406 | B1 * | 8/2002 | Kagiwata | 257/529 |
|---|---|---|---|---|
| 6,750,529 | B2 * | 6/2004 | Mori | 257/529 |
| 2005/0212081 | A1 * | 9/2005 | Kang et al. | 257/529 |

FOREIGN PATENT DOCUMENTS

| KR | 10-2002-0078623 | 10/2002 |
|---|---|---|
| KR | 10-2004-0001855 | 1/2004 |
| KR | 2006-72217 | 6/2006 |

* cited by examiner

*Primary Examiner*—Kevin M Picardat
(74) *Attorney, Agent, or Firm*—Marshall, Gerstein & Borun LLP

(57) ABSTRACT

A method of forming a metal line of a semiconductor memory device includes the steps of forming plugs of a damascene structure in a first interlayer insulating layer over a semiconductor substrate, forming a barrier metal layer, a metal layer and an anti-reflection layer on the resulting surface, etching the anti-reflection layer, the metal layer, and the barrier metal layer according a specific pattern, and forming an insulating layer on sidewalls of the metal layer.

8 Claims, 3 Drawing Sheets

METHOD OF FORMING METAL LINE OF SEMICONDUCTOR MEMORY DEVICE

CROSS-REFERENCES TO RELATED APPLICATION

Priority is claimed to Korean patent application number 10-2006-60600 filed Jun. 30, 2006, which is incorporated by reference in its entirety.

BACKGROUND OF THE INVENTION

1. Field of the Invention

The invention relates to semiconductor memory devices and, more particularly, to a method of forming a metal line of a semiconductor memory device.

2. Related Technology

A formation method of a damascene structure using tungsten (W) as a plug has been employed as a method of forming a metal line of a flash memory device. As the level of integration of devices increases, the design rule decreases, and space between patterns in which lines are formed is reduced, thus making it difficult to secure a capacitance value.

To solve the capacitance problem, it is necessary that the height of a metal layer be lowered in order to decrease a capacitance value in an interfacial junction process. However, a resistance value is increased due to the lowered height of the metal layer. Accordingly, material with a low resistivity characteristic can be formed in the interface in order to maintain the resistance value while securing the capacitance value by decreasing the height of the metal layer.

The material with a low resistivity characteristic can include copper (Cu) used in logics, aluminum (Al) used as a wire material, and the like. However, it is difficult to use aluminum (Al) because of the slurry problem of a subsequent Chemical Mechanical Polishing (CMP) process, such as a tungsten damascene process.

As an alternative method, an attempt is made to form a pattern using a Reactive Ion Etching (RIE) method after aluminum (Al) is formed. The aluminum RIE method includes forming a barrier metal layer, and then sequentially laminating aluminum and an anti-reflection layer. However, this method causes damage to sidewalls of an Al metal layer due to a difference in the etch ratio depending on material and over-etch in a subsequent etch process. Further, voids are generated when a dielectric material is formed due to the damaged sidewalls, degrading reliability.

SUMMARY OF THE INVENTION

The invention is directed to a method of forming a metal line of a semiconductor memory device, wherein loss of a metal layer at the time of an etch process can be prevented by forming a spacer layer to protect the metal layer.

In one embodiment, a method of forming a metal line of a semiconductor memory device includes the steps of forming plugs of a damascene structure in a first interlayer insulating layer over a semiconductor substrate, forming a barrier metal layer, a metal layer and an anti-reflection layer on the resulting surface, etching the anti-reflection layer, the metal layer and the barrier metal layer according a specific pattern, and forming an insulating layer on sidewalls of the metal layer.

DESCRIPTION OF SPECIFIC EMBODIMENTS

A specific embodiment according to the invention is described below with reference to the accompanying drawings.

FIGS. 1 to 6 are cross-sectional views illustrating a method of forming a metal line of a semiconductor memory device according to an embodiment of the invention.

Figure 1:
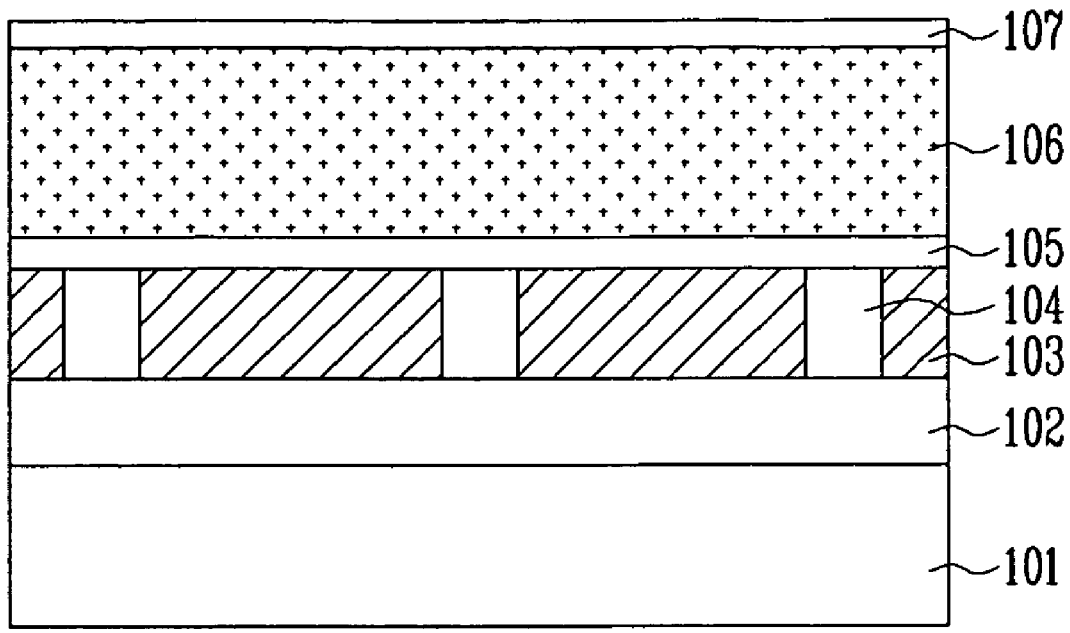
FIGS. 1 to 6 are cross-sectional views illustrating a method of forming a metal line of a semiconductor memory device according to an embodiment of the invention.

Referring to FIG. 1, a lower layer 102, including a gate, etc. is formed over a semiconductor substrate 101. A first interlayer insulating layer 103 is formed on the lower layer 102. Plugs 104 of a damascene structure are formed. A barrier metal layer 105, a metal layer 106, and an anti-reflection layer 107 are sequentially formed over the entire surface.

The barrier metal layer 105 is preferably formed by a sputtering method, and is preferably formed from Ti and TiN. The metal layer 106 for a metal line is preferably formed from aluminum (Al). The anti-reflection layer 107 is preferably formed in-situ from Ti and TiN.

Figure 2:
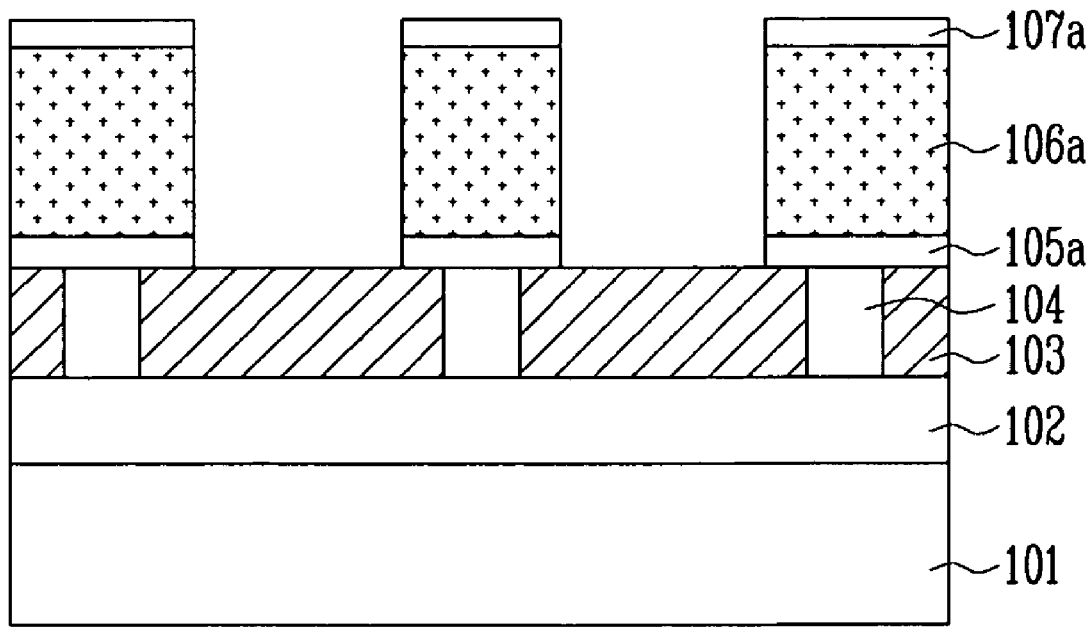

Referring to FIG. 2, a first nitride layer 108, a α-carbon layer 109, a second nitride layer 110 and a photoresist pattern 111 are sequentially formed over the anti-reflection layer 107. The first and second nitride layers 108 and 110 are preferably formed from SiON. An etch process is performed along the photoresist pattern 111.

Figure 3:
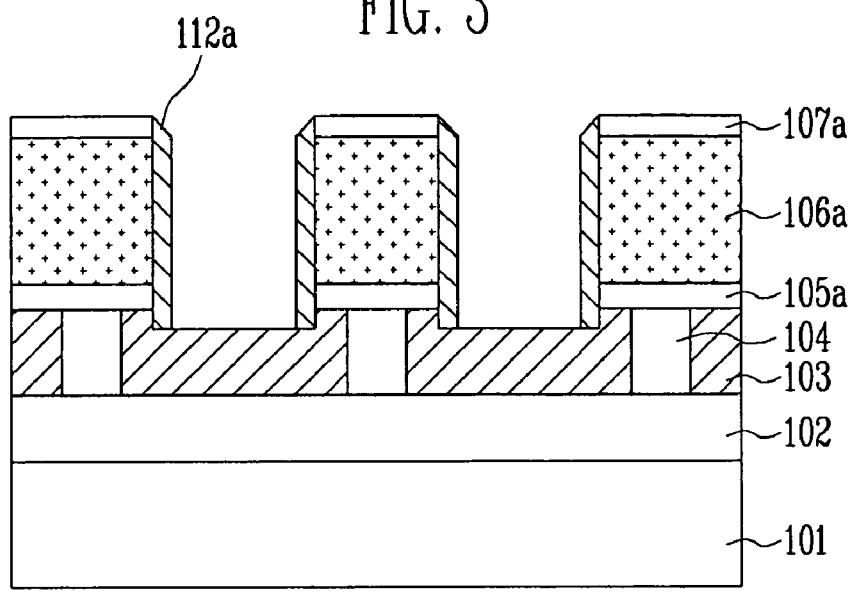

Referring to FIG. 3, a barrier metal pattern 105a is formed through a specific etch process. The first nitride layer 108, the carbon layer 109, the second nitride layer 110, and the photoresist pattern 111 are removed.

Figure 4:
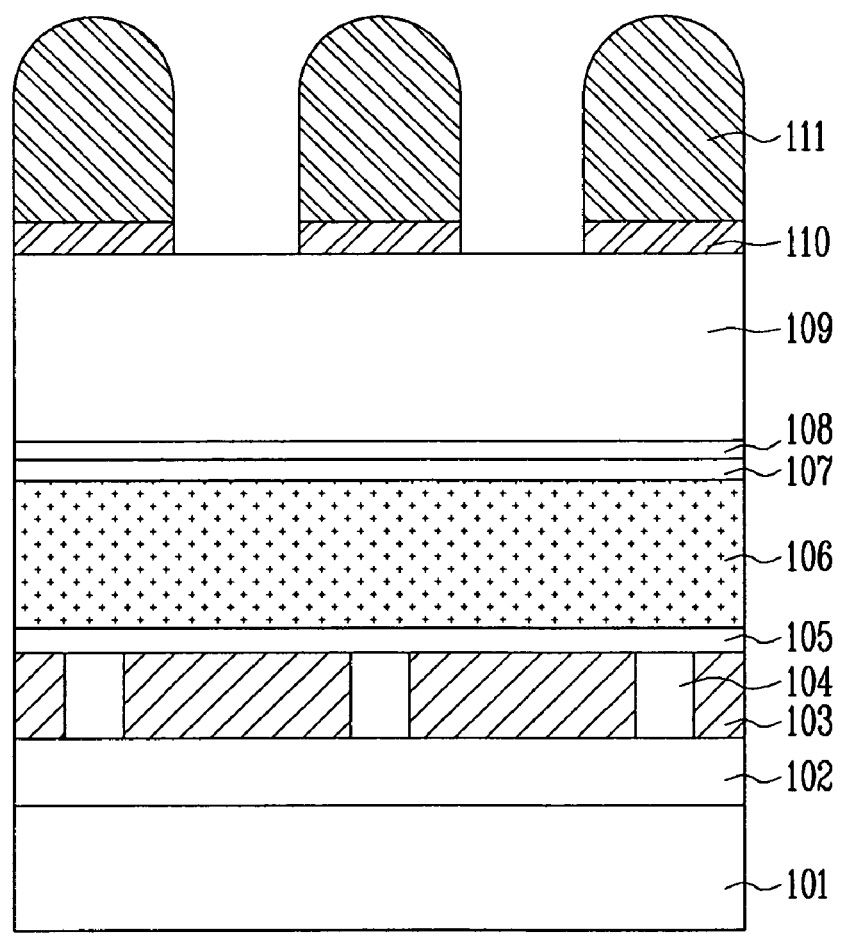

Referring to FIG. 4, an insulating layer 112 is formed on the entire surface. The insulating layer 112 is preferably formed from nitride or oxide, and is preferably formed to a thickness of 20 Å to 200 Å.

Figure 5:
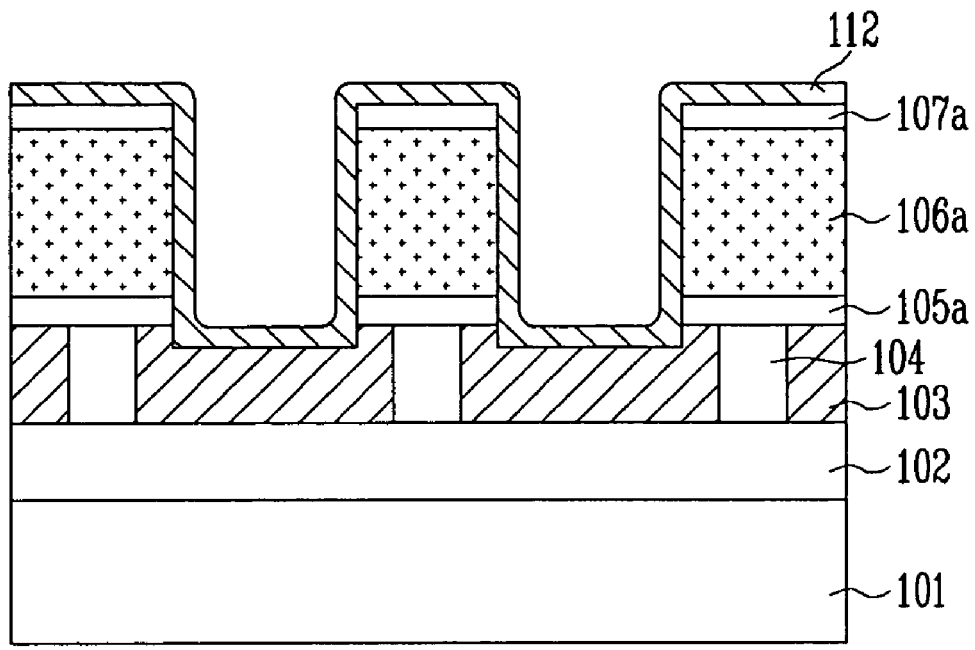

Referring to FIG. 5, in order to prevent an inter-patter bridge phenomenon, the insulating layer 112 is etched, but the insulating layer 112a remains on the sidewalls of the pattern. In this case, over etch is performed so that a portion of the lower layer 102 is etched. The etch depth of the lower layer 102 is preferably set in the range of 50 Å to 500 Å.

Figure 6:
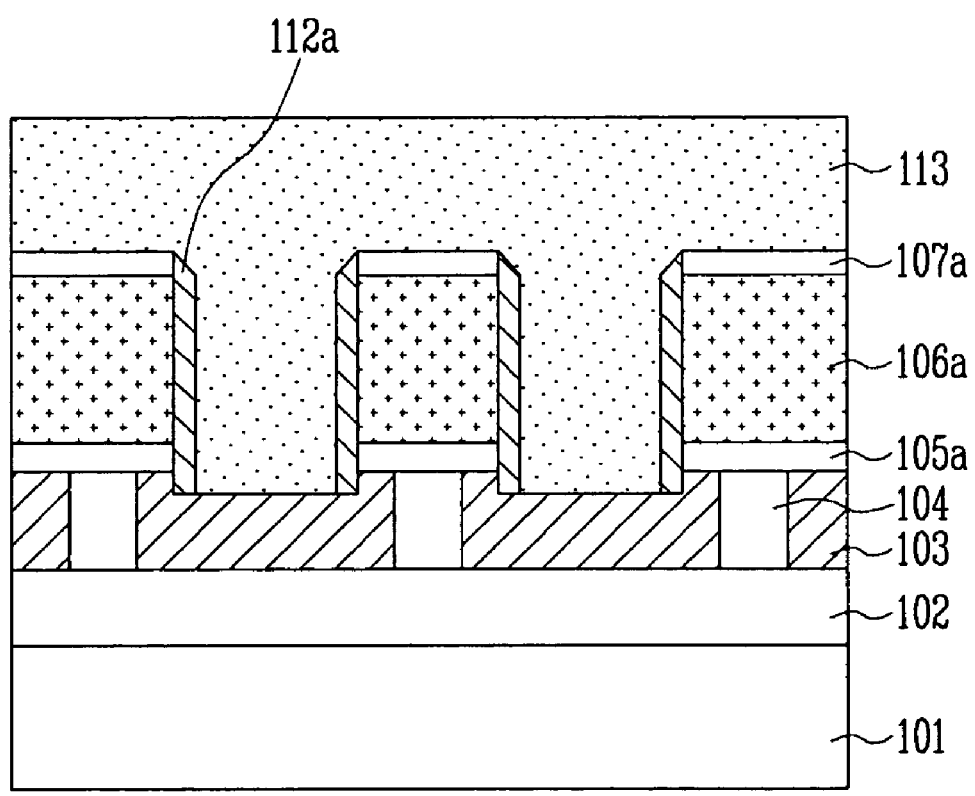

Referring to FIG. 6, a second interlayer insulating layer 113 is gap-filled on the entire surface. The second interlayer insulating layer 113 can be formed using material such as a High Density Plasma (HDP) oxide layer, for example. At this time, the remaining insulating layer 112a precludes metal layer patterns 106a from the damage of plasma when the second interlayer insulating layer 113 is gap-filled, thus preventing a reduction in the resistance of the Al metal line.

As described above, in accordance with the method of forming the metal line of the semiconductor memory device according to the invention, the spacer layer to protect the metal layer is formed. Accordingly, loss of the metal layer can be prevented at the time of an etch process. It is therefore possible to improve a metal line profile and prevent the occurrence of void in a subsequent gap-fill process.

The described embodiment of the invention is illustrative and not limiting. Various alternatives and equivalents are possible. Other additions, subtractions, or modifications are intended to fall within the scope of the invention as defined in the appended claims.

What is claimed is:

1. A method of forming a metal line of a semiconductor memory device, comprising:

forming an underlying layer over a semiconductor substrate;

forming a barrier metal layer, a metal layer and an anti-reflection layer on the underlying layer;

etching the anti-reflection layer, the metal layer and the barrier metal layer to form anti-reflection patterns, metal patterns, and barrier metal patterns;

forming spacer layers on sidewalls of the anti-reflection patterns, the metal patterns, and the barrier metal patterns; and forming a second interlayer insulating layer on the semiconductor substrate including the underlying layer.

2. The method of claim 1, comprising forming the barrier metal layer from Ti and TiN by using a sputtering method.

3. The method of claim 1, comprising forming the anti-reflection layer in-situ from Ti and TIN.

4. The method of claim 1, comprising forming the spacer layers from nitride or oxide to a thickness of 20 Å to 200 Å.

5. The method of claim 1, wherein forming the spacer layers comprises forming an insulating layer along surface of the anti-reflection patterns, metal patterns, barrier metal patterns, and the underlying layer; and etching the insulating layer to form the spacer layers on sidewalls of the anti-reflection patterns, the metal patterns, and the barrier metal patterns.

6. The method of claim 5, wherein etching the insulating layer comprises performing over etch so that a portion of the underlying layer formed over the semiconductor substrate is etched.

7. The method of claim 6, comprising over-etching the underlying layer to a depth of 50 Å to 500 Å.

8. The method of claim 1, wherein the underlying layer comprises plugs and a first interlayer insulating layer.

* * * * *